(12) United States Patent
Pramanik

(10) Patent No.: US 8,426,270 B2
(45) Date of Patent: Apr. 23, 2013

(54) MEMORY DEVICE WITH A TEXTURED LOWERED ELECTRODE

(75) Inventor: Dipankar Pramanik, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 68 days.

(21) Appl. No.: 13/188,765

(22) Filed: Jul. 22, 2011

(65) Prior Publication Data

US 2013/0023105 A1    Jan. 24, 2013

(51) Int. Cl.
- *H01L 21/336* (2006.01)
- *H01L 21/3205* (2006.01)
- *H01L 21/4763* (2006.01)

(52) U.S. Cl.
USPC ........... 438/257; 438/201; 438/211; 438/593; 438/745; 257/E21.179; 257/E21.422; 257/E21.68

(58) Field of Classification Search .................. 438/201, 438/211, 257, 593, 745; 257/E21.179, E21.422, 257/E21.68
See application file for complete search history.

(56) References Cited

U.S. PATENT DOCUMENTS

| | | |
|---|---|---|
| 2001/0013361 A1 * | 8/2001 | Fujisawa et al. .............. 136/256 |
| 2005/0168112 A1 * | 8/2005 | Aoki et al. .................... 310/358 |

* cited by examiner

*Primary Examiner* — Michelle Mandala

(57) ABSTRACT

Embodiments of the invention generally relate to memory devices and methods for manufacturing such memory devices. In one embodiment, a method for forming a memory device with a textured electrode is provided and includes forming a silicon oxide layer on a lower electrode disposed on a substrate, forming metallic particles on the silicon oxide layer, wherein the metallic particles are separately disposed from each other on the silicon oxide layer. The method further includes etching between the metallic particles while removing a portion of the silicon oxide layer and forming troughs within the lower electrode, removing the metallic particles and remaining silicon oxide layer by a wet etch process while revealing peaks separated by the troughs disposed on the lower electrode, forming a metal oxide film stack within the troughs and over the peaks of the lower electrode, and forming an upper electrode over the metal oxide film stack.

20 Claims, 3 Drawing Sheets

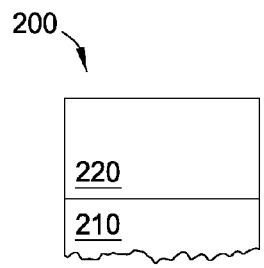
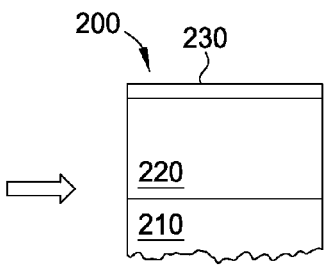
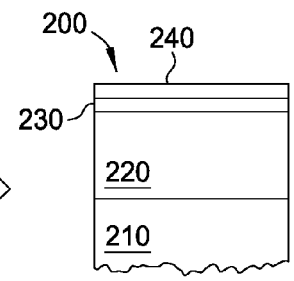
FIG. 2A　　　　FIG. 2B　　　　FIG. 2C
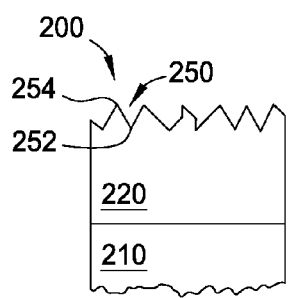
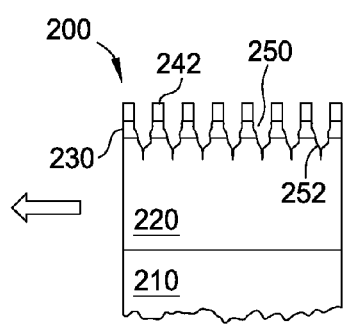
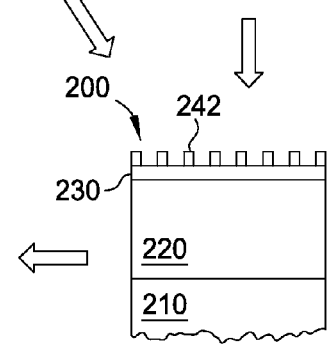
FIG. 2F　　　　FIG. 2E　　　　FIG. 2D
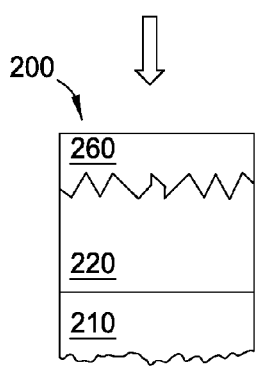
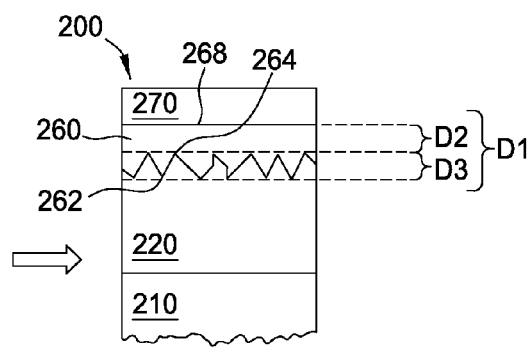
FIG. 2G　　　　FIG. 2H

MEMORY DEVICE WITH A TEXTURED LOWERED ELECTRODE

BACKGROUND OF THE INVENTION

1. Field of the Invention

Embodiments of the invention generally relate to memory devices and methods for manufacturing such memory devices.

2. Description of the Related Art

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide films has been demonstrated. Although metal oxide films such as these exhibit bistability, the resistance of these films and the ratio of the high-to-low resistance states are often insufficient to be of use within a practical nonvolatile memory device. For instance, the resistance states of the metal oxide film should preferably be significant as compared to that of the system (e.g., the memory device and associated circuitry) so that any change in the resistance state change is perceptible. The variation of the difference in resistive states is related to the resistance of the resistive switching layer. Therefore, a low resistance metal oxide film may not form a reliable nonvolatile memory device. For example, in a nonvolatile memory that has conductive lines formed of a relatively high resistance metal such as tungsten, the resistance of the conductive lines may overwhelm the resistance of the metal oxide resistive switching element. Therefore, the state of the bistable metal oxide resistive switching element may be difficult or impossible to sense.

Similar issues can arise from integration of the resistive switching memory element with current steering elements, such as diodes and/or resistors. The resistance of the resistive switching memory element (at least in its high resistance state) is preferably significant compared to the resistance of the current steering elements, so that the unvarying resistance of the current steering element does not dominate the resistance of the switching memory element, and thus reduce the measurable difference between the "on" and "off" states of the formed memory device (e.g., logic states of the device).

However, since the power that can be delivered to a circuit containing a series of resistive switching memory elements and current steering elements is typically limited in most conventional nonvolatile memory devices (e.g., CMOS driven devices), it is desirable to form each of the resistive switching memory elements and current steering elements in the circuit so that the voltage drop across each of these elements is small, and thus resistance of the series connected elements does not cause the current to decrease to an undesirable level due to the fixed applied voltage (e.g., about 2-5 volts).

As nonvolatile memory device sizes shrink, it is important to reduce the required currents and voltages that are necessary to reliably set, reset and/or determine the desired "on" and "off" states of the device to minimize resistive heating of the device and cross-talk between adjacent devices. Moreover, in cases where multiple formed memory devices are interconnected to each other and to other circuit elements it is desirable to minimize the device performance variation between one device to the next to assure that the performance of the formed circuit performs in a desirable manner.

Current ReRAM structures contain thin film stacks of metal oxide materials (e.g., hafnium oxide) between metal electrodes to form memory devices that can be switched between two different stable resistance states by the application of appropriate voltages. Initially, the deposited film stack has very low conductivity. A high voltage known as the "forming" voltage has to be initially applied to the electrodes that probably lead to localized soft "breakdown" and the formation of a switching region within the metal oxide material of the film stack. The "breakdown" process occurs randomly at the weakest point of the metal oxide. As a result, the forming voltages are determined primarily by the effective thickness of the metal oxide and also have a wide distribution. The thickness of the film stack should be large enough to minimize device failure rate while maximizing a desirable yield as well as to keep leakage levels in the "off" state below a certain specified value. The forming voltages may be too high for the existing circuitry on the chip or the formation of the switching regions may be difficult on some of the memory cells.

Therefore, there is a need for an efficient and controllable process to form a metal oxide film stack for a nonvolatile memory device.

SUMMARY OF THE INVENTION

Embodiments of the invention generally relate to nonvolatile memory devices and methods for manufacturing such memory devices. The methods for forming memory devices provide texturing or roughening the bottom or lower electrode prior to forming the metal oxide film stack over the lower electrode. The additional microscopic roughness formed on the surface of the lower electrode is compatible with the overall dimensions of the electrode and adequate to enhance the electric field in the switching regions for reducing the switching voltage. In one example, processing steps provide the formation of various geometric structures, including pyramidal structures, on the upper surface of the lower electrode. For example, pyramidal structures may have an area or base of about 3 nm by about 3 nm and a height of about 3 nm. The metal oxide film stack may be deposited or otherwise formed—layer by layer—such that as the thickness of the film stack increases, the overall top surface of the film stack becomes smoother or less rough. Therefore, the thickness of the metal oxide film stack immediately above the peaks of the microstructure will be thinner than the thickness at the troughs. An upper electrode may be formed over or on the upper surface of the metal oxide film stack. When a voltage is applied to the lower electrode, the electric field will be the greatest at the peaks due to the radius of curvature of the peaks, as well as due to the thinness of the metal oxide film stack between the top and bottom electrodes at the peaks. As a consequence, and advantageously, the switching regions will occur preferentially near these peaks. The set and reset occurs when the electric field in the metal oxide film stack exceeds a certain threshold. The enhanced electric field occurs at the peaks as in the case of forming so that set/reset voltages for this structure will be greatly enhanced over previous devices, including memory device utilizing flat electrodes.

In one embodiment, a method for forming a memory device with a textured electrode is provided and includes forming a silicon oxide layer on a lower electrode disposed on a substrate, forming metallic particles on the silicon oxide layer, wherein the metallic particles are separately disposed from each other on the silicon oxide layer. The method further includes etching between the metallic particles while removing a portion of the silicon oxide layer and forming troughs within the lower electrode, removing the metallic particles and remaining silicon oxide layer by a wet etch process while revealing peaks separated by the troughs disposed on the lower electrode, forming a metal oxide film stack within the troughs and over the peaks of the lower electrode, and forming an upper electrode over the metal oxide film stack. In some examples, the lower electrode contains a silicon material, but in alternative examples, the lower electrode contains a metal.

The metallic particles may contain at least one metal, such as nickel, gold, silver, aluminum, palladium, platinum, cobalt, alloys thereof, or combinations thereof. In many examples, the metallic particles contain nickel or a nickel alloy. The metallic particles may have an average diameter within a range from about 5 Å to about 50 Å, such as from about 10 Å to about 30 Å, for example, about 20 Å.

In some examples, the metallic particles may be formed at a temperature within a range from about 200° C. to about 600° C., such as from about 300° C. to about 450° C., during an evaporation process. In other examples, the metallic particles may be formed by an electroless deposition process or a physical vapor deposition process. In some examples, the metallic particles may be formed by depositing a metallic layer on the silicon oxide layer during a vapor deposition process, and heating the metallic layer while forming the metallic particles from the metallic layer. The metallic layer may have a thickness within a range from about 3 Å to about 20 Å. In one example, the metallic layer contains metallic nickel or a nickel alloy and may have a thickness of about 5 Å.

In some embodiments, the method further includes exposing the silicon oxide layer and the lower electrode to a plasma during a back sputtering process while removing the portion of the silicon oxide layer and forming apertures having troughs within the lower electrode. The silicon oxide layer and/or the lower electrode may be etched or otherwise removed during the back sputtering process at independent etch rates within a range from about 10 Å/min to about 200 Å/min, such as from about 20 Å/min to about 150 Å/min, from about 30 Å/min to about 120 Å/min, for example, about 60 Å/min. In some examples, the lower electrode contains a silicon material which may be removed while forming troughs within the lower electrode. A predetermined thickness of the lower electrode containing the silicon material which may be removed while forming troughs is generally within a range from about 10 Å to about 50 Å, such as from about 20 Å to about 40 Å, for example, about 30 Å.

In another embodiment, the peaks and the troughs of the lower electrode may be separated by an average vertical distance within a range from about 10 Å to about 50 Å, such as from about 20 Å to about 40 Å, for example, from about 30 Å. The peaks may be separated from each other by an average horizontal distance within a range from about 10 Å to about 50 Å, such as from about 20 Å to about 40 Å, for example, from about 30 Å. Prior to etching the lower electrode, the thickness of the lower electrode is generally within a range from about 300 Å to about 5,000 Å, such as from about 1,000 Å to about 5,000 Å, such as from about 2,000 Å to about 4,000 Å, for example, about 3,000 Å.

In some examples, the remaining silicon oxide layer may be exposed to a wet etch solution containing hydrofluoric acid during the wet etch process. The wet etch solution may contain a ratio of hydrogen fluoride to water within a range from about 50:1 to about 200:1, for example, about 100:1.

The metal oxide film stack has an upper surface, a first lower surface disposed on the peaks of the lower electrode, and a second lower surface disposed on the troughs of the lower electrode. In another embodiment, an average partial thickness of the metal oxide film stack measured between the upper surface and the first lower surface of the metal oxide film stack is less than one half of an average total thickness of the metal oxide film stack measured between the upper surface and the second lower surface of the metal oxide film stack. In many examples, the average total thickness is within a range from about 40 Å to about 60 Å, and the average partial thickness is within a range from about 10 Å to about 40 Å. In some examples, the average total thickness is within a range from about 45 Å to about 55 Å, and the average partial thickness is within a range from about 15 Å to about 25 Å.

The metal oxide film stack generally has a switching layer and a buffer layer, and may also have a coupling layer. In many examples, the switching layer contains a hafnium oxide material formed by an atomic layer deposition (ALD) process. In other examples, the buffer layer contains a metal oxide such as titanium oxide, aluminum oxide, derivatives thereof, mixtures thereof, or combinations thereof.

In another embodiment, a method for forming a memory device with a textured electrode which includes forming a silicon oxide layer on a lower electrode disposed on a substrate, depositing a metallic layer on the silicon oxide layer, and thereafter, forming metallic particles from the metallic layer such that the metallic particles are separately disposed from each other on the silicon oxide layer. The method further includes etching between the metallic particles while removing a portion of the silicon oxide layer and forming troughs within the lower electrode, removing the metallic particles and remaining silicon oxide layer by a wet etch process while revealing peaks separated by the troughs disposed on the lower electrode, forming a metal oxide film stack over the lower electrode, and forming an upper electrode over the metal oxide film stack.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2H depict various stages of the a memory device while being fabricated or otherwise formed during the method illustrated in FIG. 1, as described by embodiments herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the invention generally relate to nonvolatile memory devices and methods for manufacturing such memory devices. The methods for forming memory devices provide texturing or roughening the bottom or lower electrode prior to forming the metal oxide film stack over the lower electrode. The additional microscopic roughness formed on the surface of the lower electrode is compatible with the overall dimensions of the electrode and adequate to enhance the electric field. When a voltage is applied to the lower electrode, the field will be the highest at the peaks on the electrode due to the radius of curvature of the peaks, as well as due to the layer thinness between the top and bottom electrodes at the peaks. As a consequence, and advantageously, the switching regions will occur preferentially near these peaks. The set and reset occurs when the electric field in the films exceeds a certain threshold. The enhanced electric field occurs at these peaks so that set/reset voltages within the memory device are enhanced over previous devices, including memory device utilizing flat electrodes.

Figure 1:
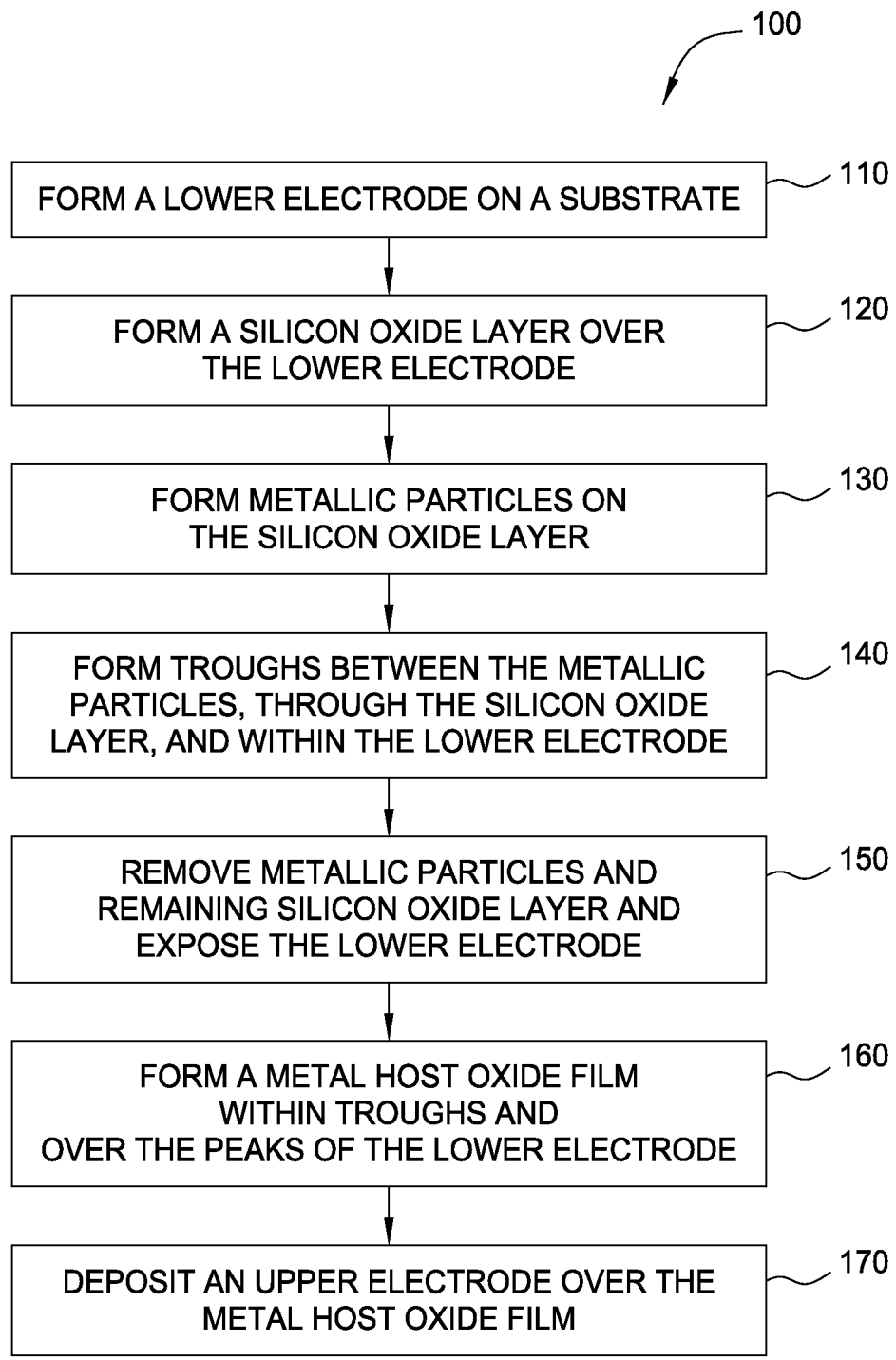
FIG. 1 is a flowchart illustrating a method to form a memory device, as described by embodiments herein.

FIG. 1 is a flowchart illustrating a method for manufacturing or otherwise forming various memory devices, as described by embodiments herein, such as process 100 which may be utilized to form resistive switching memory elements/devices, such as memory device 200, as depicted in FIG. 2H. FIGS. 2A-2H depict various stages of fabricating a memory device, such as memory device 200 while being fabricated or otherwise formed during process 100. In one embodiment, process 100 may be used to form memory device 200 and includes forming lower electrode 220 on or over substrate 210 during step 110, forming silicon oxide layer 230 on or over lower electrode 220 during step 120, forming metallic particles 242 on or over silicon oxide layer 230 during step 130, forming apertures 250 containing troughs 252 and peaks 254 between metallic particles 242, through silicon oxide layer 230, and within lower electrode 220, during step 140, removing metallic particles 242 and any remaining silicon oxide layer 230 while revealing or otherwise exposing lower electrode 220 during step 150, forming metal oxide film stack 260 on or over lower electrode 220, such as within troughs 252 and over peaks 254 of lower electrode 220 during step 160, and depositing upper electrode 270 on or over metal oxide film stack 260 during step 170.

In one embodiment, a method for forming a memory device, such as memory device 200 with a textured electrode, such as lower electrode 220, is provided and includes forming silicon oxide layer 230 on lower electrode 220 disposed on substrate 210, and forming metallic particles 242 on silicon oxide layer 230, wherein metallic particles 242 are separately disposed from each other on silicon oxide layer 230. The method further includes etching between metallic particles 242 while removing a portion of silicon oxide layer 230 and forming troughs 252 within lower electrode 220, removing metallic particles 242 and remaining silicon oxide layer 230 by a wet etch process while revealing peaks 254 separated by troughs 252 disposed on lower electrode 220, forming metal oxide film stack 260 within troughs 252 and over peaks 254 of lower electrode 220, and forming upper electrode 270 over metal oxide film stack 260.

In another embodiment, a method for forming a memory device, such as memory device 200 with a textured electrode, such as lower electrode 220, includes forming silicon oxide layer 230 on lower electrode 220 disposed on substrate 210, depositing metallic layer 240 on silicon oxide layer 230, and thereafter, and forming metallic particles 242 from metallic layer 240 such that metallic particles 242 are separately disposed from each other on silicon oxide layer 230. The method further includes etching between metallic particles 242 while removing a portion of silicon oxide layer 230 and forming troughs 252 within lower electrode 220, removing metallic particles 242 and remaining silicon oxide layer 230 by a wet etch process while revealing peaks 254 separated by troughs 252 disposed on lower electrode 220, forming metal oxide film stack 260 over lower electrode 220, and forming upper electrode 270 over metal oxide film stack 260.

FIG. 2A depicts one stage of the fabrication or otherwise formation of memory device 200 which contains lower electrode 220 deposited or otherwise formed on substrate 210 during step 110 of process 100. Substrate 210 supports lower electrode 220 while depositing and forming each of the layers within memory device 200—and for subsequent manufacturing processes.

Substrate 210 may be a wafer or other substrate and may contain silicon, doped silicon, Group III-V materials (e.g., GaAs), or derivates thereof. In most examples described herein, substrate 210 is a crystalline silicon wafer that may be doped with a dopant element. Lower electrode 220 contains at least one conductive material. In many embodiments, lower electrode 220 contains a silicon material or a silicon-based material, such as a doped silicon material, for example a p-type (P+) silicon material or a n-type (N+) silicon material. In some specific examples, lower electrode 220 contains a doped polycrystalline silicon material, such as a n-type polysilicon. In alternative embodiments, lower electrode 220 contains at least one material, such as a metal, a metal oxide, a metal nitride, a metal nitride silicide, a metal oxynitride, a metal carbides, doped variants thereof, or combinations thereof. Exemplary metal-based electrode materials or non-silicon based materials for electrode 220 include titanium, tantalum, aluminum, a titanium-aluminum alloy, copper or silicon-doped aluminum, molybdenum, molybdenum nitride, iridium oxide, doped variants thereof, or combinations thereof.

Prior to exposing lower electrode 220 to the etching processes described herein, lower electrode 220 may have a thickness within a range from about 300 Å to about 5,000 Å. In some examples, the thickness of lower electrode 220 may be within a range from about 1,000 Å to about 5,000 Å, such as from about 2,000 Å to about 4,000 Å, for example, about 3,000 Å. In other examples, the thickness of lower electrode 220 may be within a range from about 300 Å to about 3,000 Å, such as from about 500 Å to about 2,000 Å, for example, about 1,000 Å.

FIG. 2B depicts another stage of the fabrication or otherwise formation of memory device 200 which contains silicon oxide layer 230 deposited, formed, or otherwise disposed on or over lower electrode 220 during step 120. Silicon oxide layer 230 contains a silicon oxide material, such as silicon oxide, silicon dioxide, silicon oxynitride, doped variants thereof, mixtures thereof, or combinations thereof. Generally, silicon oxide layer 230 may have a thickness within a range from about 2 Å to about 25 Å, such as from about 4 Å to about 20 Å, such as from about 5 Å to about 15 Å, for example, from about 8 Å to about 10 Å.

In some embodiments, silicon oxide layer 230 may be formed by a thermal or plasma oxidation of the silicon material contained within lower electrode 220. Therefore, the silicon oxide material may be an oxidized derivative of the silicon material, such as n-type, doped polycrystalline silicon. The silicon oxide material is exposed to at least one oxidizing agent during the oxidation process. The oxidizing agent may contain or be formed of or generated from an oxygen source that includes oxygen ($O_2$), atomic oxygen (O), ozone ($O_3$), nitrous oxide ($N_2O$), nitric oxide (NO), nitrogen dioxide ($NO_2$), dinitrogen pentoxide ($N_2O_5$), hydrogen peroxide ($H_2O_2$), a de-ionized water and ozone mixture, derivatives thereof, plasmas thereof, or combinations thereof.

In one example of a thermal oxidation process, lower electrode 220 may be heated to a temperature within a range from about 500° C. to about 1,000° C. for a time period within a range from about 15 seconds to about 5 minutes. For example, lower electrode 220 may be heated to a temperature of about 800° C. for about 60 seconds within a rapid thermal anneal (RTA) chamber containing an atmosphere of dry oxygen gas during a thermal oxidation process.

In an example of a plasma or active oxidation process, lower electrode 220 may be heated to or maintained at a temperature within a range from about 20° C. to about 1,000° C. for a time period within a range from about 1 second to about 120 seconds. For example, lower electrode 220 may be exposed to a mixture of de-ionized water and ozone at a temperature of about 100° C. for about 60 seconds during a plasma or active oxidation process.

In other embodiments, lower electrode 220 may contain a silicon-based electrode material or a metal-based electrode material and silicon oxide layer 230 may be deposited or otherwise formed on or over lower electrode 220 during a deposition process. The silicon oxide material of silicon oxide layer 230 may be formed by a deposition process, such as chemical vapor deposition (CVD), low pressure CVD (LP-CVD), plasma-enhanced CVD (PE-CVD), atomic layer deposition (ALD), plasma-enhanced ALD (PE-ALD), or similar techniques. In some examples, a silicon precursor and an oxidizing agent may be flowed into a deposition while forming silicon oxide layer 230 on or over lower electrode 220. In an alternative embodiment, a protective insulating layer may be deposited, formed, or otherwise disposed on or over lower electrode 220 instead of silicon oxide layer 230 (not shown). In one example, protective insulating layer may contain a silicon nitride material or a silicon oxynitride material.

FIGS. 2C-2D depict other stages of the fabrication or otherwise formation of memory device 200 which contains metallic layer 240 deposited, formed, or otherwise disposed on or over silicon oxide layer 230, as depicted in FIG. 2C. Alternatively, metallic particles 242 may be deposited, formed, or otherwise disposed on or over silicon oxide layer 230, as depicted in FIG. 2D. In one embodiment, step 130 of process 100 includes depositing metallic layer 240 on silicon oxide layer 230, and thereafter, forming metallic particles 242 from metallic layer 240, as illustrated when advancing from FIG. 2B to FIGS. 2C-2D. Metallic particles 242 are formed, positioned, or otherwise disposed separate from each other on silicon oxide layer 230. In another embodiment, step 130 includes directly or indirectly forming metallic particles 242 on silicon oxide layer 230, as illustrated when advancing from FIG. 2B directly to FIG. 2D.

Metallic particles 242 may contain at least one metal, such as nickel, gold, silver, aluminum, palladium, platinum, cobalt, alloys thereof, or combinations thereof. In many examples, metallic particles 242 contain nickel or a nickel alloy. Metallic particles 242 may have an average diameter within a range from about 5 Å to about 50 Å, such as from about 10 Å to about 30 Å, for example, about 20 Å.

In some examples, metallic particles 242 may be formed at a temperature within a range from about 200° C. to about 600° C., such as from about 300° C. to about 450° C., during an evaporation process. In other examples, metallic particles 242 may be formed by an electroless deposition process, a PVD process, an ALD process, or a CVD process. In some examples, metallic particles 242 may be formed by depositing metallic layer 240 on silicon oxide layer 230 during a vapor deposition process, and heating metallic layer 240 while forming metallic particles 242 from metallic layer 240. Metallic layer 240 may have a thickness within a range from about 3 Å to about 20 Å. In one example, metallic layer 240 contains nickel and has a thickness of about 5 Å.

FIG. 2E depicts another stage of the fabrication or otherwise formation of memory device 200 which contains apertures 250 formed through silicon oxide layer 230 and extending into lower electrode 220 during step 140 of process 100. In some embodiments, step 140 includes exposing silicon oxide layer 230 and lower electrode 220 to a plasma during a back sputtering process while removing a portion of silicon oxide layer 230 and forming apertures 250 having troughs 252 within lower electrode 220. In various examples, lower electrode 220 may contain a silicon material (e.g., polysilicon) or a metal material (e.g., titanium or titanium nitride) and be exposed to a dry or plasma etch process, a back sputtering process, or a wet etch process while forming apertures 250 within lower electrode 220. In an alternative embodiment, a protective insulating layer, instead of silicon oxide layer 230, may be exposed to a plasma during a back sputtering process while removing a portion of the protective insulating layer and forming apertures 250 having troughs 252 within lower electrode 220 at step 140.

In many examples, silicon oxide layer 230, lower electrode 220, and/or the protective insulating layer may be etched or otherwise removed during the back sputtering process. The back sputtering process exposes silicon oxide layer 230 or the protective insulating layer as well as lower electrode 220 to a plasma, such as an inert gas plasma (e.g., argon plasma) while removing silicon oxide material and/or other materials from the exposed portion of silicon oxide layer 230 or the protective insulating layer and removing silicon material from the exposed portion of lower electrode 220. In some examples, the back sputter etching may be performed within a parallel plate plasma reactor using an argon plasma. In one example, the plasma reactor is maintained with a pressure of about 6 mTorr and at a power setting of about 200 W.

Silicon oxide layer 230, the protective insulating layer, and/or lower electrode 220 may each be etched or otherwise removed at an independent etch rate, such as within a range from about 10 Å/min to about 200 Å/min, such as from about 20 Å/min to about 150 Å/min, from about 30 Å/min to about 120 Å/min, for example, about 60 Å/min. In some examples, lower electrode 220 contains a silicon material which may be removed while forming troughs 252 within lower electrode 220. A predetermined thickness of lower electrode 220 containing the silicon material which may be removed while forming troughs 252 is generally within a range from about 10 Å to about 50 Å, such as from about 20 Å to about 40 Å, for example, about 30 Å.

In another embodiment, peaks 254 and troughs 252 of lower electrode 220 may be separated by an average vertical distance within a range from about 10 Å to about 50 Å, such as from about 20 Å to about 40 Å, for example, from about 30 Å. Peaks 254 may be separated from each other by an average horizontal distance within a range from about 10 Å to about 50 Å, such as from about 20 Å to about 40 Å, for example, from about 30 Å.

FIG. 2F depicts another stage of the fabrication or otherwise formation of memory device 200 which includes removing metallic particles 242 and remaining silicon oxide layer 230 or protective insulating layer by a wet etch process while revealing peaks 254 separated by troughs 252 disposed on lower electrode 220 during step 150 of process 100.

In some examples, the remaining silicon oxide layer 230 or protective insulating layer may be exposed to a wet etch solution containing hydrofluoric acid during the wet etch process. The wet etch solution may contain a ratio of hydrogen fluoride to water within a range from about 50:1 to about 200:1, for example, about 100:1. In other examples, the remaining silicon oxide layer 230 or protective insulating layer may be exposed to other a wet etch solution containing hydrochloric acid, sulfuric acid, hydrogen peroxide, a surfactant, or other additives during the wet etch process. Subsequently, the exposed or otherwise revealed surfaces of lower electrode 220, including troughs 252 and peaks 254 formed therein, may be rinsed with deionized water during step 150.

FIG. 2G depicts another stage of the fabrication or otherwise formation of memory device 200 which includes forming metal oxide film stack 260 within troughs 252 and over peaks 254 of lower electrode 220 during step 160 of process 100. Metal oxide film stack 260 generally has a switching layer and a buffer layer, and may also have a coupling layer. In many examples, the switching layer contains a hafnium oxide material formed by an ALD process. In other examples, the buffer layer contains a metal oxide such as titanium oxide, aluminum oxide, derivatives thereof, mixtures thereof, or combinations thereof.

In some embodiments, a coupling layer is a buffering layer that may be disposed on or within metal oxide film stack 260 and provides access to defects within metal oxide film stack 260 during memory operations performed by memory device 200. A coupling layer generally contains a metal oxide material, such as zirconium oxide or aluminum oxide, but in some embodiments, a coupling layer may contain a metal layer (e.g., metallic titanium) or a metal nitride layer (e.g., titanium nitride). In other embodiments, a coupling layer may be deposited as a metal layer that will partially or fully oxidize upon the deposition of upper electrode 270 or upon annealing. A coupling layer may facilitate switching at upper electrode 270 by creating defects near upper electrode 270. For example, if a coupling layer contains a metal such as titanium, during an anneal (such as rapid thermal oxidation or a vacuum anneal), a coupling layer can attract oxygen from the adjacent metal oxide a switching layer, thereby creating oxygen vacancies in metal oxide film stack 260 while oxidizing a coupling layer.

Generally, a coupling layer is thin enough to provide access to defects in metal oxide film stack 260. In some embodiments, a coupling layer may be thinner than metal oxide film stack 260. In one example a coupling layer may have a thickness that is less than 25% of the thickness of metal oxide film stack 260, or a thickness that is less than 10% of the thickness of metal oxide film stack 260. A coupling layer may have a thickness within a range from about 3 Å to about 100 Å. In some embodiments, a coupling layer may have a thickness within a range from about 5 Å to about 25 Å, such as, from about 8 Å to about 20 Å. In other embodiments, a coupling layer may have a thickness within a range from about 15 Å to about 80 Å, such as, from about 20 Å to about 60 Å.

In various embodiments, a buffering layer may optionally be contained within metal oxide film stack 260, as depicted in FIGS. 2G-2H. A buffering layer may be continuous or discontinuous across the substrate surface and may contain a single layer or multiple layers, such as a host oxide layer, a coupling layer, a switching layer, or other types of layer. At least one buffering of other layer may be disposed below, above, or between a switching layer and a coupling layer. A buffering layer may contain at least one metal, in metallic form, (e.g., Al, Ti, Hf, Zr, Ta, La, Y, or alloys thereof), metal oxide (e.g., aluminum oxide, titanium oxide, hafnium oxide, zirconium oxide, tantalum oxide, lanthanum oxide, or yttrium oxide), metal nitride (e.g., aluminum nitride, titanium nitride, hafnium nitride, zirconium nitride, tantalum nitride, lanthanum nitride, or yttrium nitride), metal oxynitride (e.g., aluminum oxynitride, titanium oxynitride, hafnium oxynitride, zirconium oxynitride, tantalum oxynitride, lanthanum oxynitride, or yttrium oxynitride), derivatives thereof, alloys thereof, or combinations thereof. In some embodiments, a buffering layer may have a thickness within a range from about 5 Å to about 1,000 Å, such as, from about 50 Å to about 500 Å, such as from about 100 Å to about 200 Å.

The various layers and/or materials of the switching layers, the buffering layers, the coupling layers, or other layers contained within metal oxide film stack 260 or memory device 200 may be deposited or otherwise formed by ALD, PE-ALD, CVD, LP-CVD, PE-CVD, physical vapor deposition (PVD), epitaxy processes, electroless deposition, or combinations thereof.

Memory device 200 containing metal oxide film stack 260 may optionally be exposed to a first annealing process, such as a post metal oxide anneal. During the post metal oxide anneal, metal oxide film stack 260 may be heated to an annealing temperature within a range from about 250° C. to about 800° C., such as from about 400° C. to about 700° C., or from about 500° C. to about 600° C., for example, about 550° C. Generally, metal oxide film stack 260 may be heated for a time period within a range from about 30 seconds to about 10 minutes, such as from about 1 minute to about 8 minutes, or from about 4 minutes to about 6 minutes during the post metal oxide anneal. The first annealing process may be conducted within an annealing chamber, vacuum chamber, deposition chamber, or other processing chamber that provides heat to the layers contained within memory device 200, such as metal oxide film stack 260.

In some examples, metal oxide film stack 260 may be heated to an annealing temperature within a range from about 475° C. to about 625° C. for a time period within a range from about 3 minutes to about 7 minutes during the post metal oxide anneal. In one example, the annealing temperature of about 550° C. for about 5 minutes is used during the annealing process.

FIG. 2H depicts another stage of the fabrication or otherwise formation of memory device 200 which includes forming upper electrode 270 over metal oxide film stack 260 during step 170 of process 100. FIG. 2H depicts metal oxide film stack 260 having an upper surface, such as upper surface 268, a first lower surface, such as lower surface 264, disposed on, over, or adjacent to peaks 254 of lower electrode 220, and a second lower surface, such as lower surface 262, disposed within, on, over, or adjacent to troughs 252 of lower electrode

220. The thickness of metal oxide film stack 260 varies relative to the adjacent underlying feature of lower electrode 220, such as troughs 252 and peaks 254 of lower electrode 220.

The average total thickness D1 of metal oxide film stack 260 may be measured as the distance extending between upper surface 268 and lower surface 262 of metal oxide film stack 260. The average partial thickness D2 of metal oxide film stack 260 may be measured as the distance extending between upper surface 268 and lower surface 264 of metal oxide film stack 260. Additionally, the remaining thickness D3 of the average total thickness D1 may be measured as the distance extending between both lower surfaces 262 and 264 of metal oxide film stack 260, as well as the vertical distance extending between a trough 252 and a neighboring peak 254. The average total thickness D1 of metal oxide film stack 260 is equal to or substantially equal to the sum of the average partial thickness D2 and the remaining thickness D3.

Generally, the average total thickness D1 is the thickest portion of metal oxide film stack 260 while the average partial thickness D2 is the thinnest portion of metal oxide film stack 260. In one embodiment, the average partial thickness D2 is less than one half of the average total thickness D1 of metal oxide film stack 260. Therefore, if the average partial thickness D2 is less than one half of the average total thickness D1, then the remaining thickness D3 is greater than one half of the average total thickness D1 and a D2/D3 ratio is less than 1.

In many examples, the average total thickness D1 may be within a range from about 40 Å to about 60 Å, the average partial thickness D2 may be within a range from about 10 Å to about 40 Å, and the remaining thickness D3 may be within a range from about 15 Å to about 50 Å. In some examples, the average total thickness D1 may be within a range from about 45 Å to about 55 Å, the average partial thickness D2 may be within a range from about 15 Å to about 25 Å and the remaining thickness D3 may be within a range from about 25 Å to about 35 Å. In one example, the average total thickness D1 is about 50 Å, the average partial thickness D2 is about 20 Å, and the remaining thickness D3 is about 30 Å.

The average vertical distance that separates peaks 254 and troughs 252 of lower electrode 220 generally has the same or substantially the same length as the remaining thickness D3 of metal oxide film stack 260. Therefore, the average vertical distance and the remaining thickness D3 may independently be within a range from about 10 Å to about 50 Å, such as from about 20 Å to about 40 Å, for example, from about 30 Å.

Lower electrode 220 and upper electrode 270 may contain different materials. In some embodiments, lower electrode 220 and upper electrode 270 have work functions that differ by an energy level within a range from about 0.1 eV to about 1 eV, such as, from about 0.4 eV to about 0.6 eV. In some examples, lower electrode 220 may contain a n-type polysilicon material which has a work function within a range from about 4.1 eV to about 4.15 eV, while upper electrode 270 may contain a titanium nitride material which has a work function within a range from about 4.5 eV to about 4.6 eV. Other electrode materials that may be contained within lower electrode 220 and/or upper electrode 270 include p-type polysilicon (about 4.9 eV to about 5.3 eV), transition metals, transition metal alloys, transition metal nitrides, transition metal carbides, tungsten (about 4.5 eV to about 4.6 eV), tantalum nitride (about 4.7 eV to about 4.8 eV), molybdenum oxide (about 5.1 eV), molybdenum nitride (about 4.0 eV to about 5.0 eV), iridium (about 4.6 eV to about 5.3 eV), iridium oxide (about 4.2 eV), ruthenium (about 4.7 eV), and ruthenium oxide (about 5.0 eV). Other potential electrode materials for lower electrode 220 and/or upper electrode 270 include a titanium/aluminum alloy (about 4.1 eV to about 4.3 eV), nickel (about 5.0 eV), tungsten nitride (about 4.3 eV to about 5.0 eV), tungsten oxide (about 5.5 eV to about 5.7 eV), aluminum (about 4.2 eV to about 4.3 eV), copper or silicon-doped aluminum (about 4.1 eV to about 4.4 eV), copper (about 4.5 eV), hafnium carbide (about 4.8 eV to about 4.9 eV), hafnium nitride (about 4.7 eV to about 4.8 eV), niobium nitride (about 4.95 eV), tantalum carbide (about 5.1 eV), tantalum silicon nitride (about 4.4 eV), titanium (about 4.1 eV to about 4.4 eV), vanadium carbide (about 5.15 eV), vanadium nitride (about 5.15 eV), and zirconium nitride (about 4.6 eV). For some embodiments described herein, the higher work function electrode receives a positive pulse (as measured compared to a common reference potential) during a reset operation, although other configurations are possible.

In other embodiments, the higher work function electrode receives a negative pulse during a reset operation. Upper electrode 270 may contain metals, metal carbides, metal oxides, or metal nitrides, which include platinum, palladium, ruthenium, ruthenium oxide, iridium, iridium oxide, titanium, titanium nitride, tungsten, tungsten oxide, tungsten nitride, tungsten carbide, tantalum, tantalum oxide, tantalum nitride, tantalum silicon nitride, tantalum carbide, molybdenum, molybdenum oxide, molybdenum nitride, titanium aluminum alloys, nickel, aluminum, doped aluminum, aluminum oxide, copper, hafnium carbide, hafnium nitride, niobium nitride, vanadium carbide, vanadium nitride, zirconium nitride, derivatives thereof, mixtures thereof, or combinations thereof. In many examples, upper electrode 270 contains titanium, titanium nitride, alloys thereof, or combinations thereof.

Memory device 200 containing upper electrode 270 disposed on or over metal oxide film stack 260 may optionally be exposed to a second annealing process, such as a post electrode anneal. The post electrode anneal is conducted subsequent to the formation of upper electrode 270. During the post electrode anneal, memory device 200, including upper electrode 270 and metal oxide film stack 260, may be heated to an annealing temperature within a range from about 400° C. to about 1,200° C., such as from about 500° C. to about 900° C., or from about 700° C. to about 800° C., for example, about 750° C. Generally, memory device 200 may be heated for a time period within a range from about 10 seconds to about 5 minutes, such as from about 20 seconds to about 4 minutes, or from about 40 seconds to about 2 minutes during the post upper electrode anneal. The post electrode anneal may be conducted within an annealing chamber, vacuum chamber, deposition chamber, or other processing chamber that provides heat to the layers contained within memory device 200, such as metal oxide film stack 260 and upper electrode 270.

In some examples, memory device 200 containing upper electrode 270 may be heated to an annealing temperature within a range from about 700° C. to about 800° C. for a time period within a range from about 40 seconds to about 2 minutes during the post upper electrode anneal at step 135. In one example, the annealing temperature of about 750° C. for about 1 minute is used during the annealing process.

Figure 3:
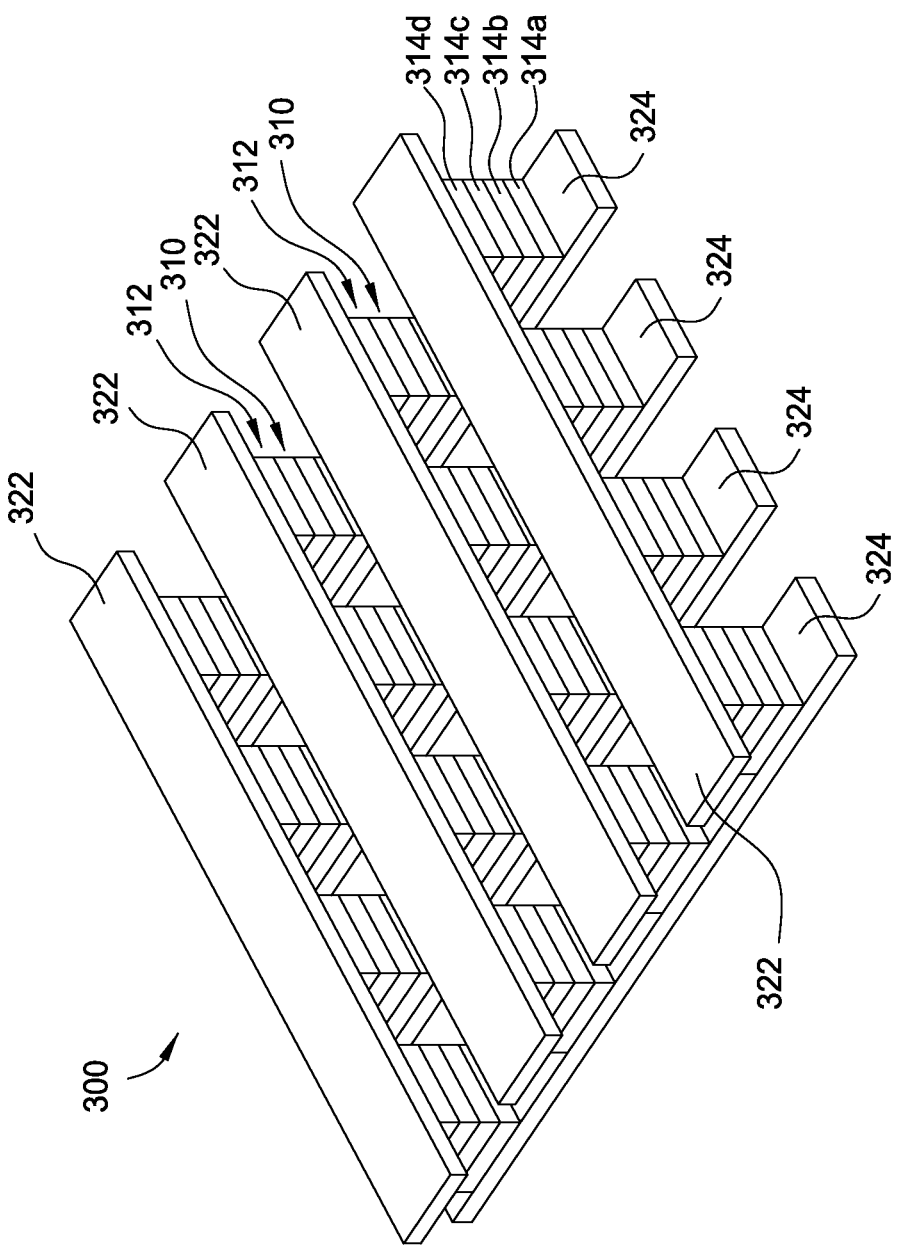
FIG. 3 depicts a memory array of resistive switching memory devices, as described by another embodiment herein.

FIG. 3 depicts a memory array 300 of resistive switching memory devices 310, as described by embodiments herein. Each memory device 310 contains at least one switching memory element 312, and may contain multiple switching memory elements 312. In some embodiments, memory devices 310 may be a plurality of memory devices 200, depicted in FIG. 2H. Memory array 300 may be part of a larger memory device or other integrated circuit structure, such as a system on a chip type device. Read and write circuitry is connected to switching memory devices 310 using electrodes 322 and electrodes 324. Electrodes, such as upper electrodes 322 and lower electrodes 324, are sometimes referred to as word lines and bit lines, and are used to read and write data into the memory elements 312 in the switching memory devices 310. Individual switching memory devices 310 or groups of switching memory devices 310 can be addressed using appropriate sets of electrodes 322 and 324. The memory elements 312 in the switching memory devices 310 may be formed from a plurality of layers 314a, 314b, 314c, and 314d containing various materials, as indicated schematically in FIG. 3. In addition, memory arrays such as memory array 300 can be stacked in a vertical fashion to make multilayer memory array structures.

According to various embodiments, resistive-switching memory elements/devices are described herein. The memory elements/devices generally have a structure in which resistive-switching insulating layers are surrounded by two conductive electrodes. Some embodiments described herein are memory elements that include electrodes of different materials (e.g., one electrode is doped silicon and one is titanium nitride) surrounding a resistive-switching layer of a metal oxide (e.g., hafnium oxide), thickness (about 20 Å to about 100 Å) and a coupling layer that is substantially thinner than the resistive-switching layer (e.g., less than 25% the thickness of the resistive-switching layer). In some embodiments, the coupling layer may be a metallic material such as titanium. Memory elements including the coupling layer have exhibited improved switching characteristics (e.g., lower set, reset, and forming voltages, and better retention). In some embodiments, the resistive-switching layer includes a higher bandgap material (e.g., a material having a bandgap greater than 4 eV such as hafnium oxide, aluminum oxide, tantalum oxide, yttrium oxide, zirconium oxide, cerium oxide, alloys thereof, derivatives thereof, mixtures thereof, or combinations thereof), however other resistive-switching layers may include materials having a bandgap less than 4 eV (e.g., titanium oxide).

In other embodiments, a metal-rich metal oxide switching layer and techniques for forming the metal-rich switching layer are described. The metal-rich switching layer includes increased numbers of defects (e.g., oxygen vacancies), which may be manipulated to improve switching characteristics. The metal-rich switching layer may be deposited, for example, by reducing the degree of oxidation that is occurs in an ALD or PE-ALD process. In another embodiment, the coupling layer is a metallic layer (e.g., metallic titanium) that, when the memory is annealed, attracts oxygen from the adjacent metal oxide switching layer. This results in an at least partially oxidized coupling layer (e.g., the coupling layer becomes at least partially titanium oxide) and a switching layer that is metal rich. In further embodiments, a metallic capping layer deposited on a coupling layer may be used as a source of dopant metal which is diffused into the metal host oxide of the switching layer.

The switching characteristics of the resistive-switching memory elements may be tailored by controlling the defects within the metal oxides. Switching characteristics include operating voltages (e.g., set, reset, and forming voltages), operating currents (e.g., on and off currents), and data retention. Defect control may be achieved by type, density, energy level, and spatial distribution within the switching layer. These defects then modulate the current flow based on whether they are filled (passivated/compensated) or unfilled (uncompensated). Adding different layers, controlling the formation of the switching layer, implanting, controlling stress, certain thermal treatments are all used to control the defect characteristics. In addition, the defects need not be mobile. For example, a coupling layer and a metallic capping layer may be used to control locations, depths, densities, and/or type of defects, and techniques may be used to form a switching layer having an increased number of defects.

Additionally, the switching layer may have any phase (e.g., crystalline and amorphous) or mixtures of multiple phases. Amorphous-phase metal oxides may have increased resistivity, which in some embodiments can lower the operational currents of the device to reduce potential damage to the memory element.

While the foregoing is directed to embodiments of the invention, other and further embodiments of the invention may be devised without departing from the basic scope thereof, and the scope thereof is determined by the claims that follow.

The invention claimed is:

1. A method for forming a memory device, comprising:
    forming a silicon oxide layer on a lower electrode comprising silicon disposed on a substrate;
    forming metallic particles on the silicon oxide layer, wherein the metallic particles are separately disposed from each other on the silicon oxide layer;
    etching between the metallic particles while removing a portion of the silicon oxide layer and forming troughs within the lower electrode;
    removing the metallic particles and a remaining silicon oxide layer by a wet etch process while revealing peaks separated by the troughs disposed on the lower electrode;
    forming a metal oxide film stack within the troughs and over the peaks of the lower electrode; and
    forming an upper electrode over the metal oxide film stack.

2. The method of claim 1, wherein the metallic particles have an average diameter within a range from about 5 Å to about 50 Å and comprise a metal selected from the group consisting of nickel, gold, silver, aluminum, palladium, platinum, cobalt, alloys thereof, and combinations thereof.

3. The method of claim 2, wherein the metallic particles comprise nickel or a nickel alloy.

4. The method of claim 2, wherein the metallic particles are formed by an evaporation process, a physical vapor deposition process, or an electroless deposition process.

5. The method of claim 1, wherein the metallic particles are formed by:
    depositing a metallic layer on the silicon oxide layer during a vapor deposition process; and
    heating the metallic layer while forming the metallic particles from the metallic layer.

6. The method of claim 5, wherein the metallic layer has a thickness within a range from about 3 Å to about 20 Å.

7. The method of claim 6, wherein the metallic layer comprises nickel and has a thickness of about 5 Å.

8. The method of claim 1, further comprising exposing the silicon oxide layer and the lower electrode to a plasma during a back sputtering process while removing the portion of the silicon oxide layer and forming the trough within the lower electrode.

9. The method of claim 8, on wherein the lower electrode is removed at an etch rate within a range from about 30 Å/min to about 120 Å/min during the back sputtering process.

10. The method of claim 1, wherein forming troughs within the lower electrode includes removing a thickness of the lower electrode within a range from about 10 Å to about 50 Å.

11. The method of claim 9, wherein the peaks and the troughs are separated by an average vertical distance within a range from about 10 Å to about 50 Å and the peaks are separated from each other by an average horizontal distance within a range from about 10 Å to about 50 Å.

12. The method of claim 1, wherein the metal oxide film stack has an upper surface, a first lower surface disposed on the peaks of the lower electrode, and a second lower surface disposed on the troughs of the lower electrode.

13. The method of claim 12, wherein an average partial thickness of the metal oxide film stack measured between the upper surface and the first lower surface of the metal oxide film stack is less than one half of an average total thickness of the metal oxide film stack measured between the upper surface and the second lower surface of the metal oxide film stack.

14. The method of claim 13, wherein the average total thickness is within a range from about 40 Å to about 60 Å, and the average partial thickness is within a range from about 10 Å to about 40 Å.

15. The method of claim 1, wherein the metal oxide film stack comprises at least a switching layer and a buffer layer and the switching layer comprises hafnium oxide formed by an atomic layer deposition process.

16. The method of claim 1, wherein the metal oxide film stack comprises at least a switching layer and a buffer layer and the buffer layer comprises a metal oxide selected from the group consisting of titanium oxide, aluminum oxide, derivatives thereof, mixtures thereof, and combinations thereof.

17. The method of claim 1, wherein the lower electrode comprises N-type, polycrystalline silicon and the upper electrode comprises titanium nitride or alloys thereof.

18. A method for forming a memory device, comprising:
forming a silicon oxide layer on a lower electrode disposed on a substrate;
depositing a metallic layer on the silicon oxide layer;
forming metallic particles from the metallic layer, wherein the metallic particles are separately disposed from each other on the silicon oxide layer;
etching between the metallic particles while removing a portion of the silicon oxide layer and forming troughs within the lower electrode;
removing the metallic particles and a remaining silicon oxide layer by a wet etch process while revealing peaks separated by the troughs disposed on the lower electrode; and
forming a metal oxide film stack over the lower electrode.

19. The method of claim 18, wherein the metallic layer has a thickness within a range from about 3 Å to about 20 Å and comprises nickel or a nickel alloy.

20. A method for forming a memory device, comprising:
forming a silicon oxide layer on a lower electrode comprising a metal disposed on a substrate;
forming metallic particles on the silicon oxide layer, wherein the metallic particles are separately disposed from each other on the silicon oxide layer;
etching between the metallic particles while removing a portion of the silicon oxide layer and forming troughs within the lower electrode;
removing the metallic particles and a remaining silicon oxide layer by a wet etch process while revealing peaks separated by the troughs disposed on the lower electrode;
forming a metal oxide film stack within the troughs and over the peaks of the lower electrode; and
forming an upper electrode over the metal oxide film stack.

* * * * *